US010453942B2

(12) United States Patent
Sung et al.

(10) Patent No.: US 10,453,942 B2
(45) Date of Patent: Oct. 22, 2019

(54) TRANSPARENT ACTIVE LAYER, THIN FILM TRANSISTOR COMPRISING SAME, AND METHOD FOR MANUFACTURING SAME

(71) Applicant: IUCF-HYU (INDUSTRY-UNIVERSITY COOPERATION FOUNDATION HANYANG UNIVERSITY), Seoul (KR)

(72) Inventors: Myung Mo Sung, Seoul (KR); Kyu-Seok Han, Seoul (KR); Kwan Hyuck Yoon, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 15/947,969

(22) Filed: Apr. 9, 2018

(65) Prior Publication Data

US 2018/0233584 A1 Aug. 16, 2018

Related U.S. Application Data

(63) Continuation of application No. PCT/KR2016/011285, filed on Oct. 8, 2016.

(30) Foreign Application Priority Data

Oct. 8, 2015 (KR) .................. 10-2015-0141686

(51) Int. Cl.
*H01L 29/66* (2006.01)
*H01L 27/32* (2006.01)
(Continued)

(52) U.S. Cl.
CPC .... *H01L 29/66742* (2013.01); *H01L 21/0262* (2013.01); *H01L 21/02422* (2013.01);
(Continued)

(58) Field of Classification Search
CPC ... H01L 29/66; H01L 29/667; H01L 29/6674; H01L 29/66742; H01L 27/32;
(Continued)

(56) References Cited

U.S. PATENT DOCUMENTS

| 2007/0194296 A1* | 8/2007 | Murakami | H01L 33/22 257/13 |
| 2010/0044702 A1* | 2/2010 | Urayama | H01L 29/7869 257/43 |
| 2010/0109002 A1* | 5/2010 | Itagaki | H01L 29/247 257/43 |

FOREIGN PATENT DOCUMENTS

| KR | 10-2009-0071358 A | 7/2009 |
| KR | 10-2009-0099140 A | 9/2009 |

(Continued)

OTHER PUBLICATIONS

International Search Report of PCT/KR2016/011285 dated Jan. 10, 2017.

*Primary Examiner* — Monica D Harrison
(74) *Attorney, Agent, or Firm* — Sughrue Mion, PLLC

(57) ABSTRACT

A method of fabricating a thin film transistor includes preparing a plastic substrate, forming a transparent active layer on the plastic substrate through an atomic layer deposition method by providing a first source including zinc on the plastic substrate and providing a second source including sulfur on the plastic substrate, providing a gate electrode overlapping with the transparent active layer, and providing a gate insulating layer between the gate electrode and the (Continued)

transparent active layer. A ratio of the providing of the first source to the providing of the second source ranges from 7:1 to 13:1.

9 Claims, 16 Drawing Sheets

(51) Int. Cl.
*H01L 29/786* (2006.01)
*H01L 21/02* (2006.01)
*H01L 27/12* (2006.01)
*H01L 29/24* (2006.01)

(52) U.S. Cl.
CPC .. *H01L 21/02488* (2013.01); *H01L 21/02557* (2013.01); *H01L 27/1218* (2013.01); *H01L 27/1225* (2013.01); *H01L 27/32* (2013.01); *H01L 27/3248* (2013.01); *H01L 27/3262* (2013.01); *H01L 29/242* (2013.01); *H01L 29/66969* (2013.01); *H01L 29/7869* (2013.01); *H01L 29/78603* (2013.01)

(58) Field of Classification Search
CPC . H01L 27/324; H01L 27/3248; H01L 27/326; H01L 27/3262; H01L 21/02
USPC .......................................................... 257/43
See application file for complete search history.

(56) References Cited

FOREIGN PATENT DOCUMENTS

| KR | 10-2011-0099422 A | 9/2011 |
|----|-------------------|--------|
| KR | 10-2013-0128280 A | 11/2013 |
| KR | 10-2015-0016789 A | 2/2015 |
| KR | 10-2015-0026747 A | 3/2015 |
| KR | 10-2016-0009120 A | 1/2016 |

* cited by examiner

[Fig. 1]
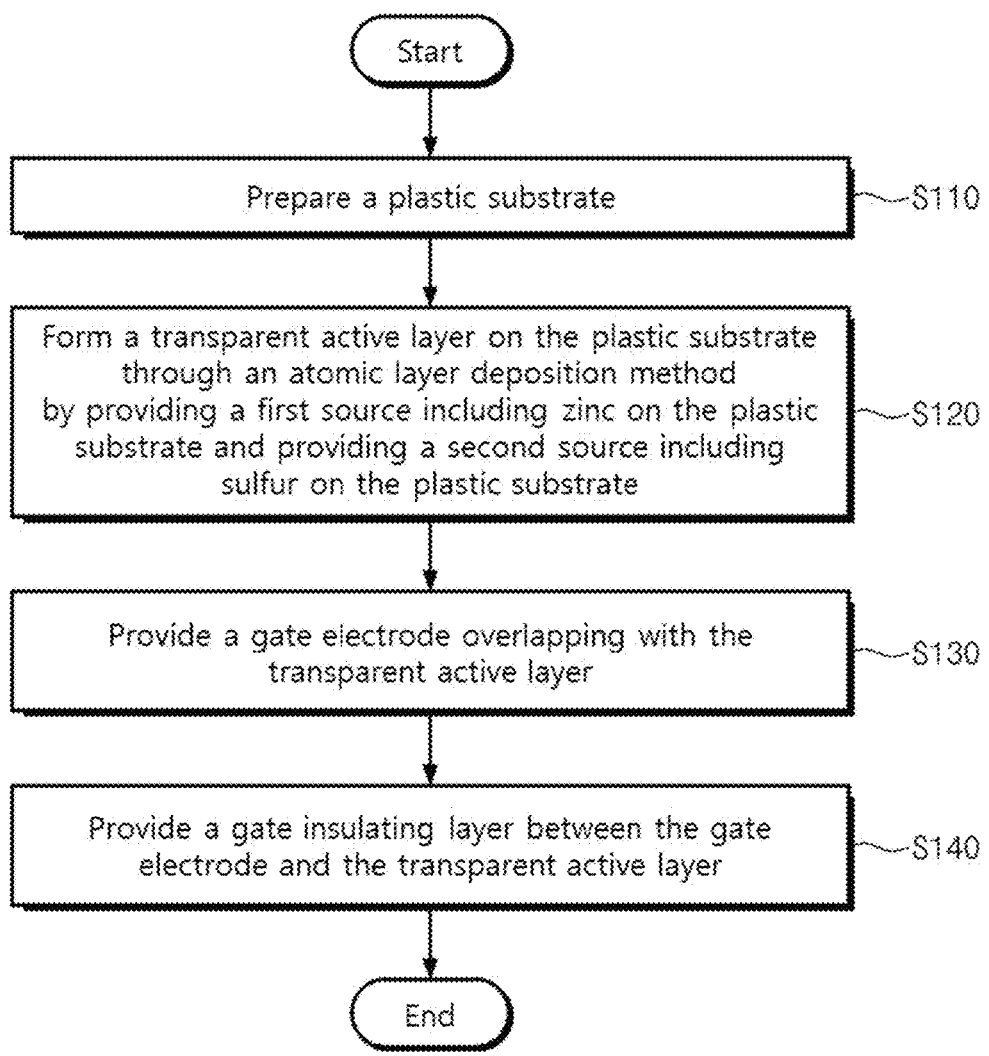

[Fig. 2]
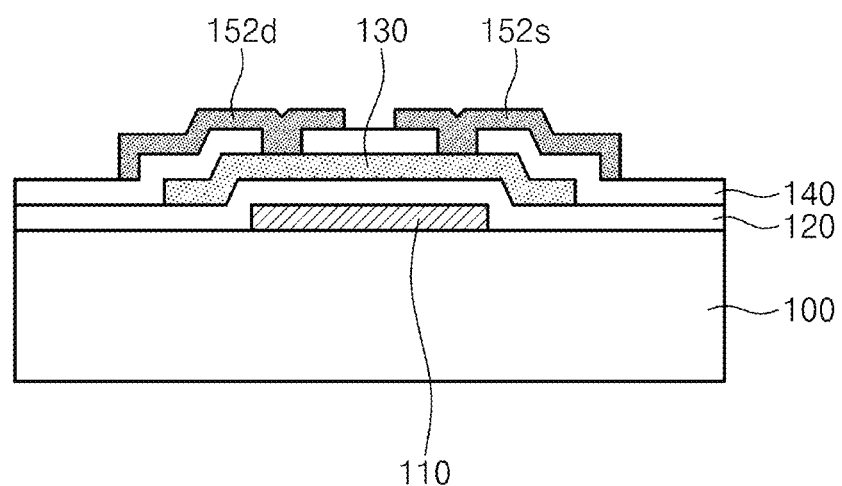

[Fig. 3]
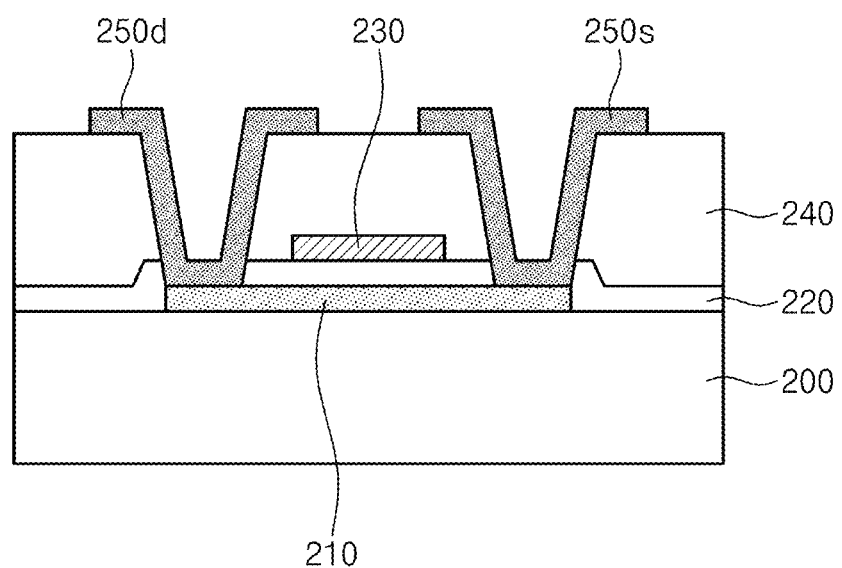

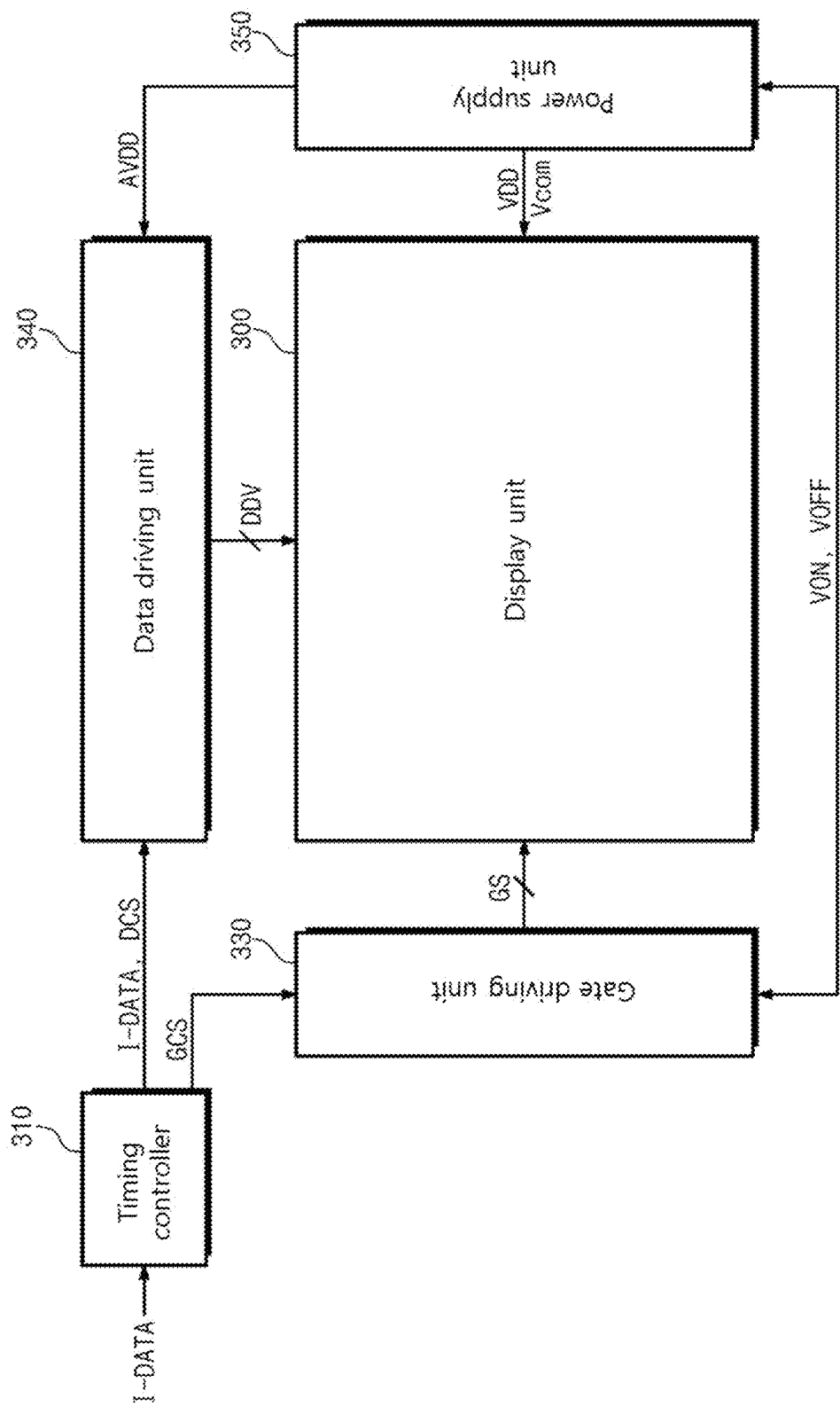
[Fig. 4]

[Fig. 5a]
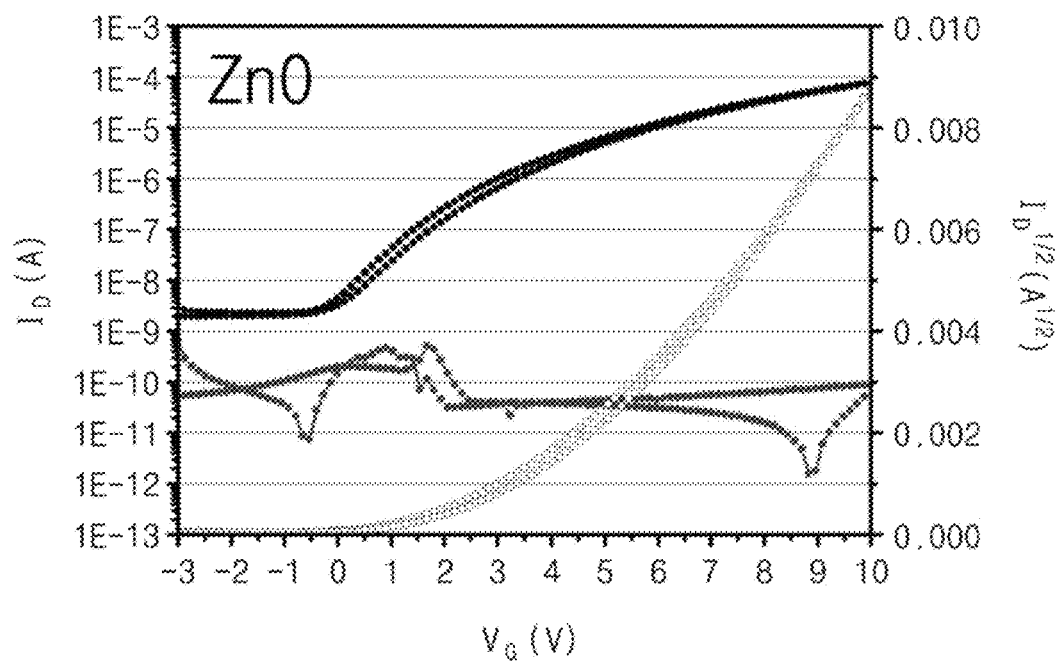

[Fig. 5b]
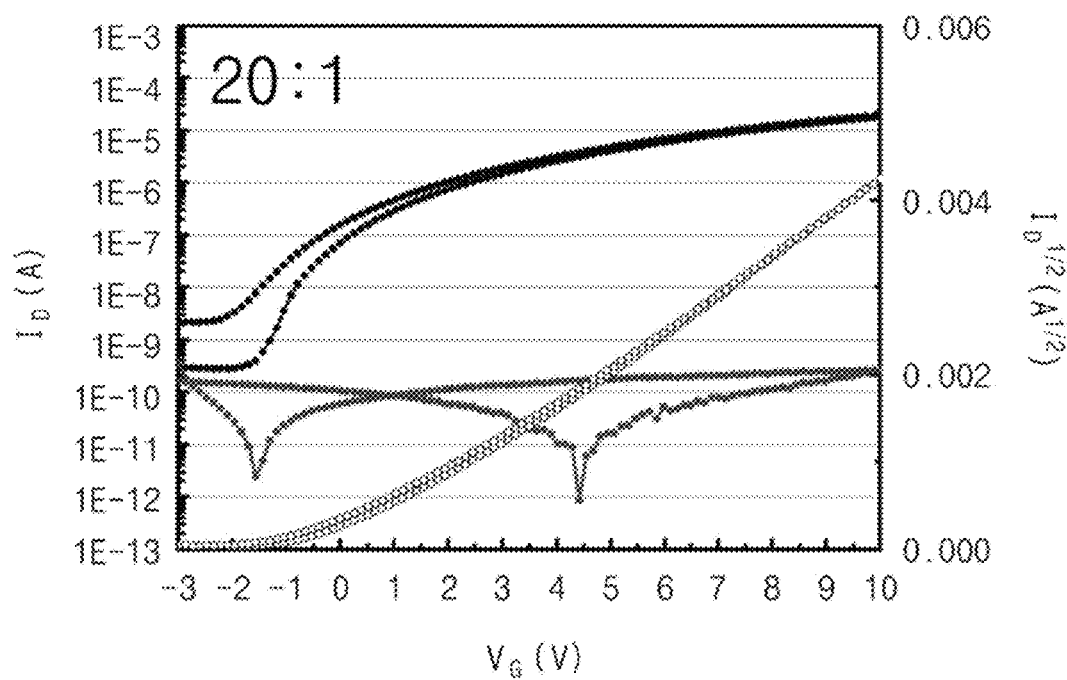

[Fig. 5c]
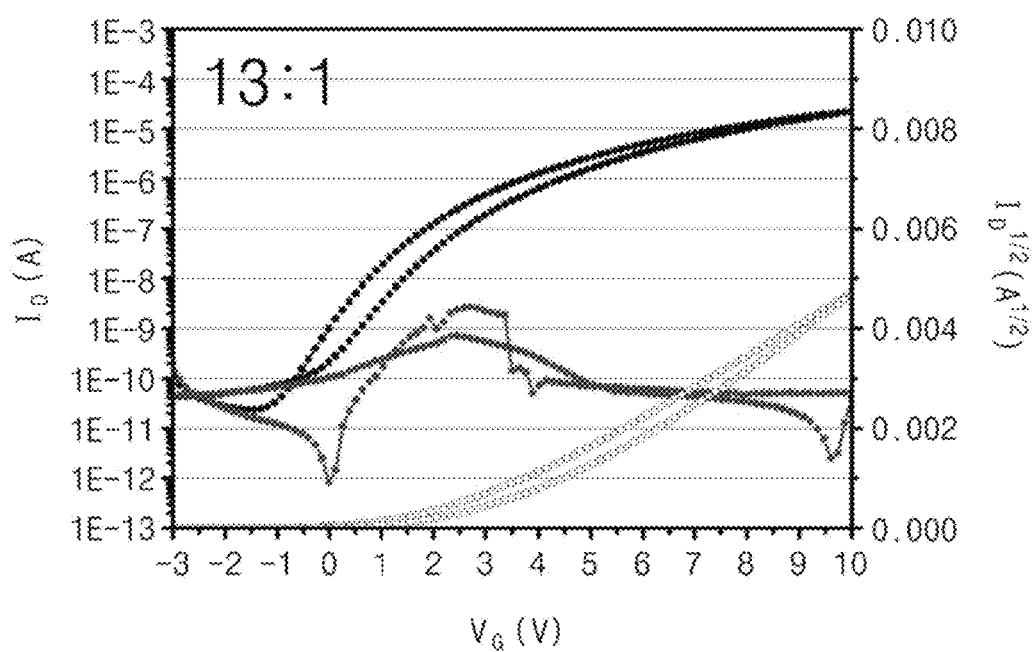

[Fig. 5d]
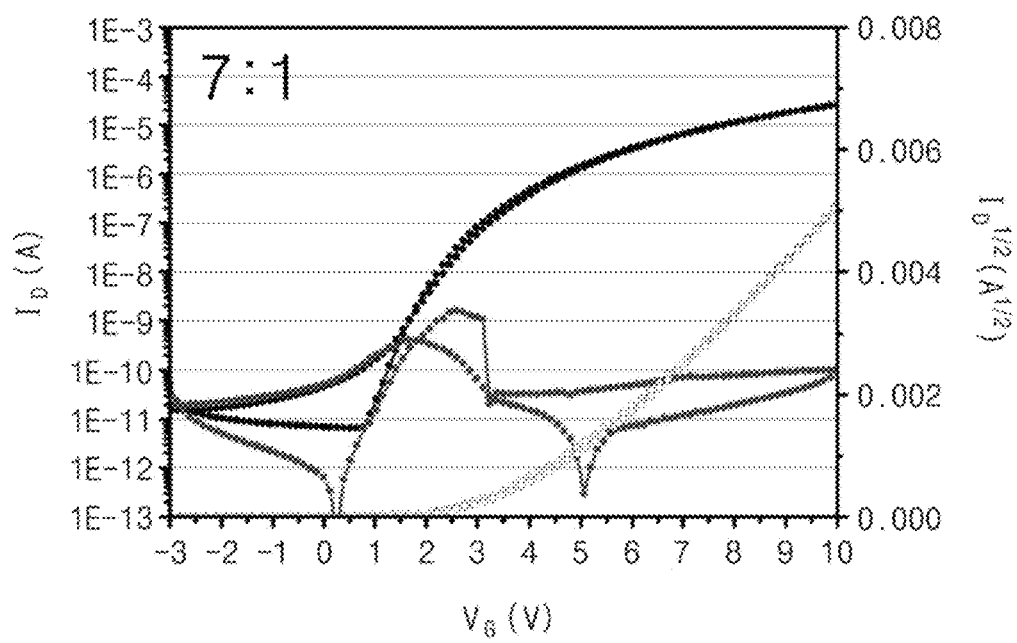

[Fig. 5e]
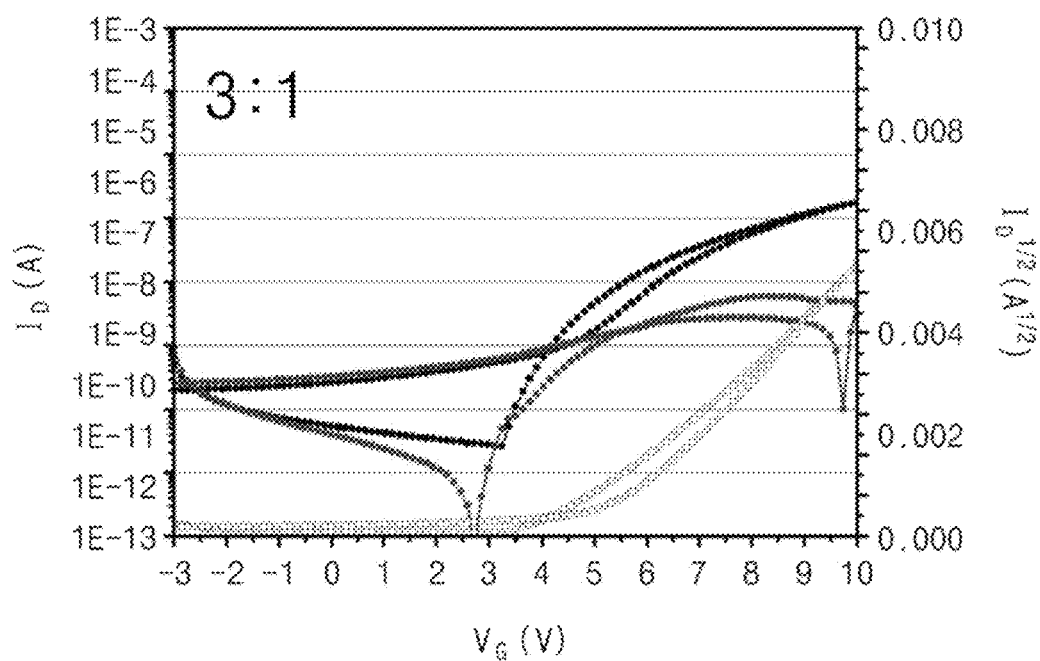

[Fig. 6]
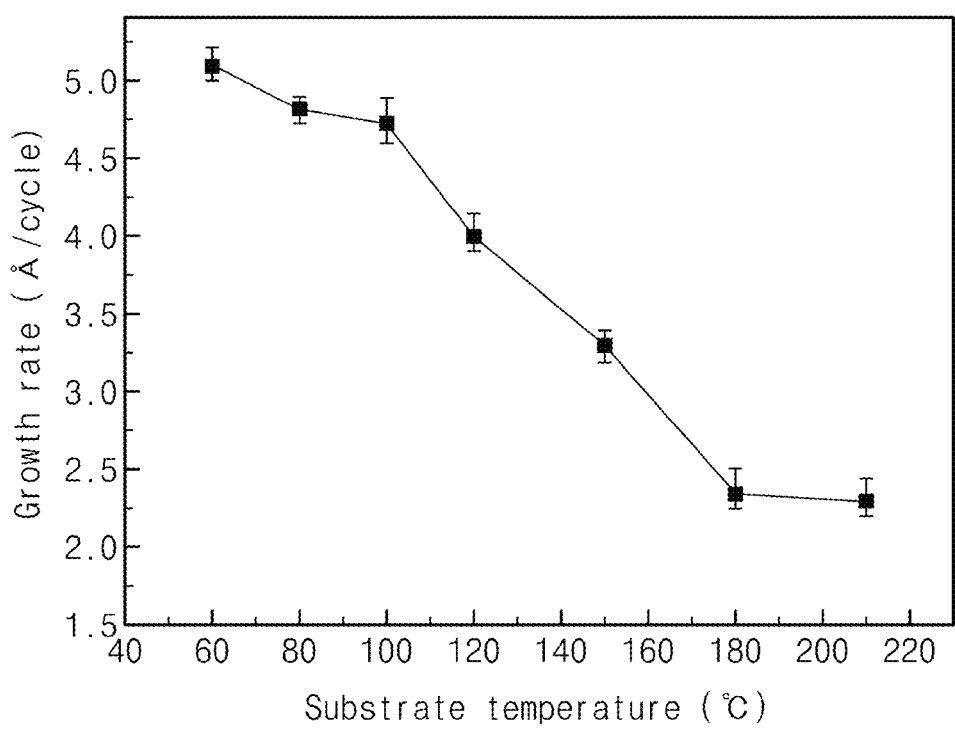

[Fig. 7]
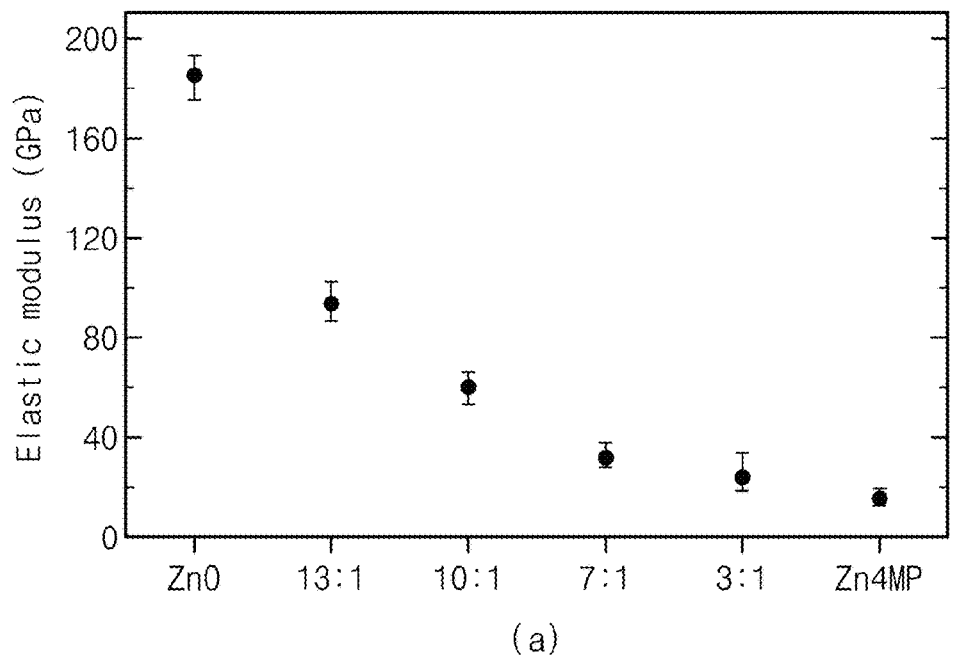
(a)
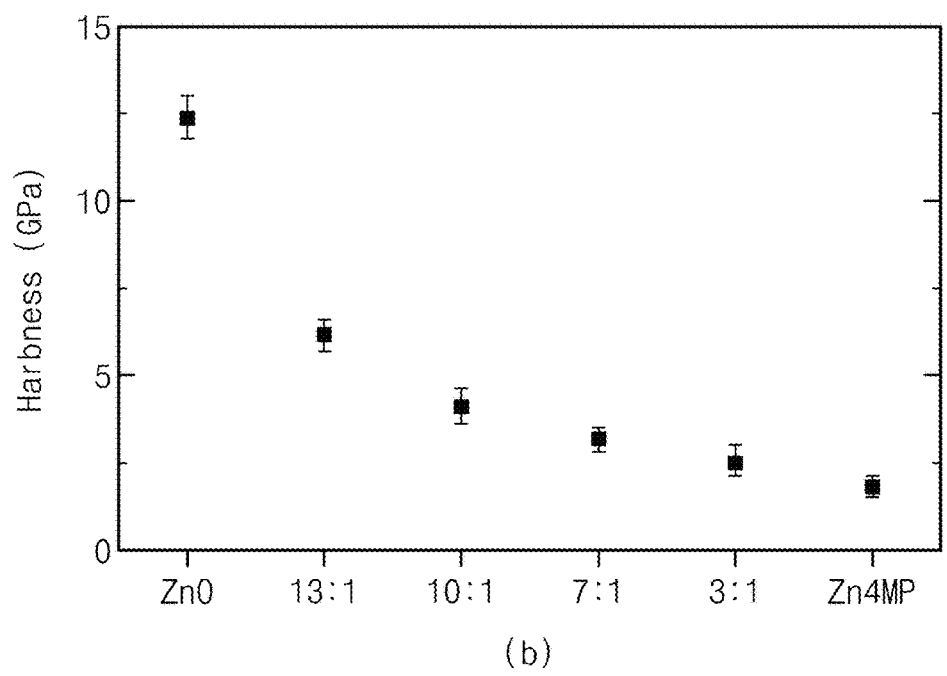
(b)

[Fig. 8a]
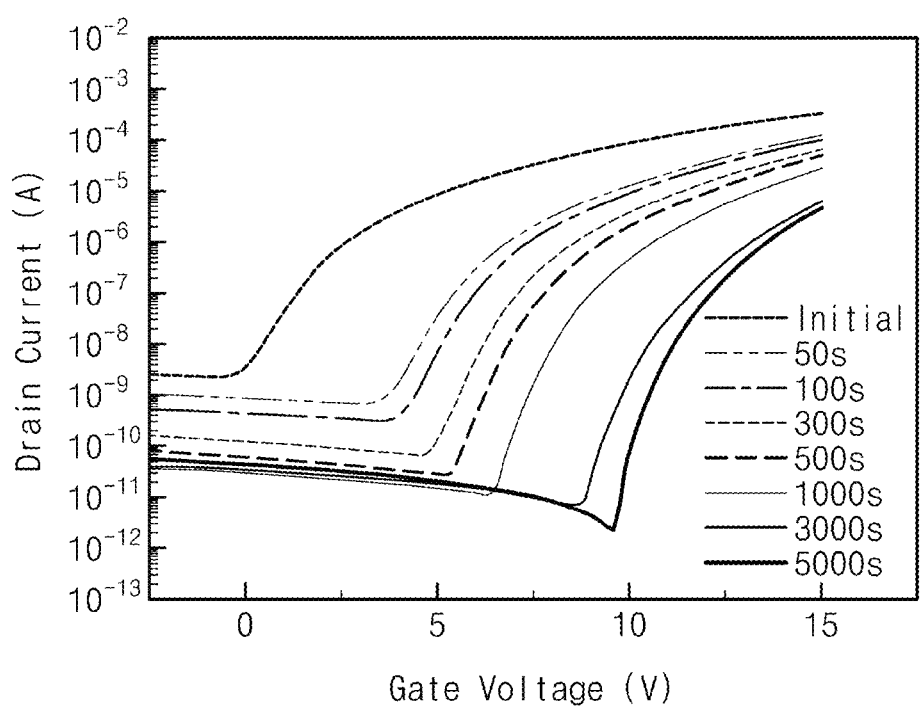

[Fig. 8b]
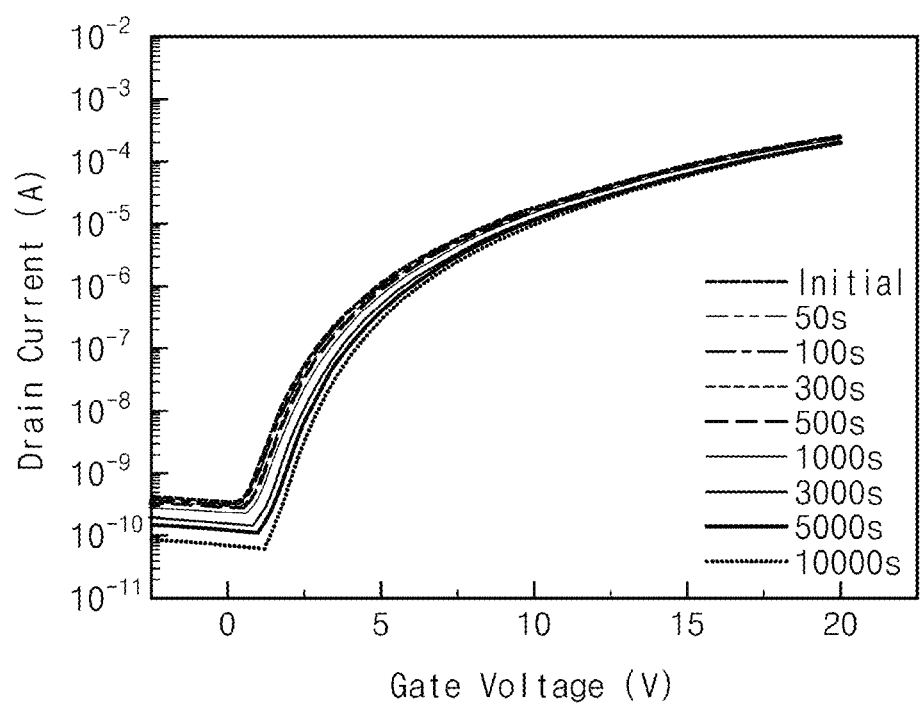

[Fig. 8c]
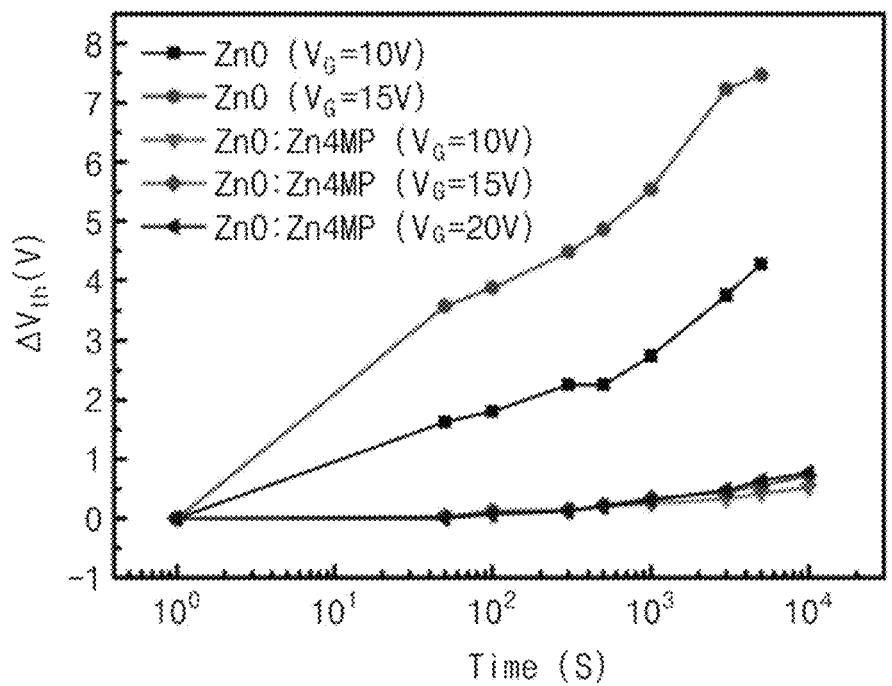

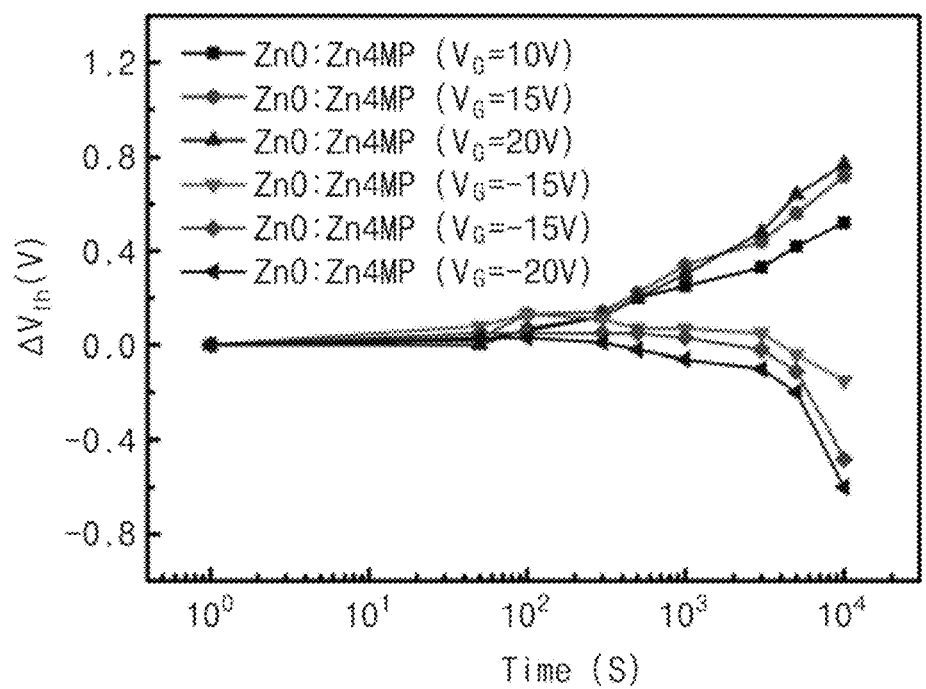
[Fig. 8d]

[Fig. 9]
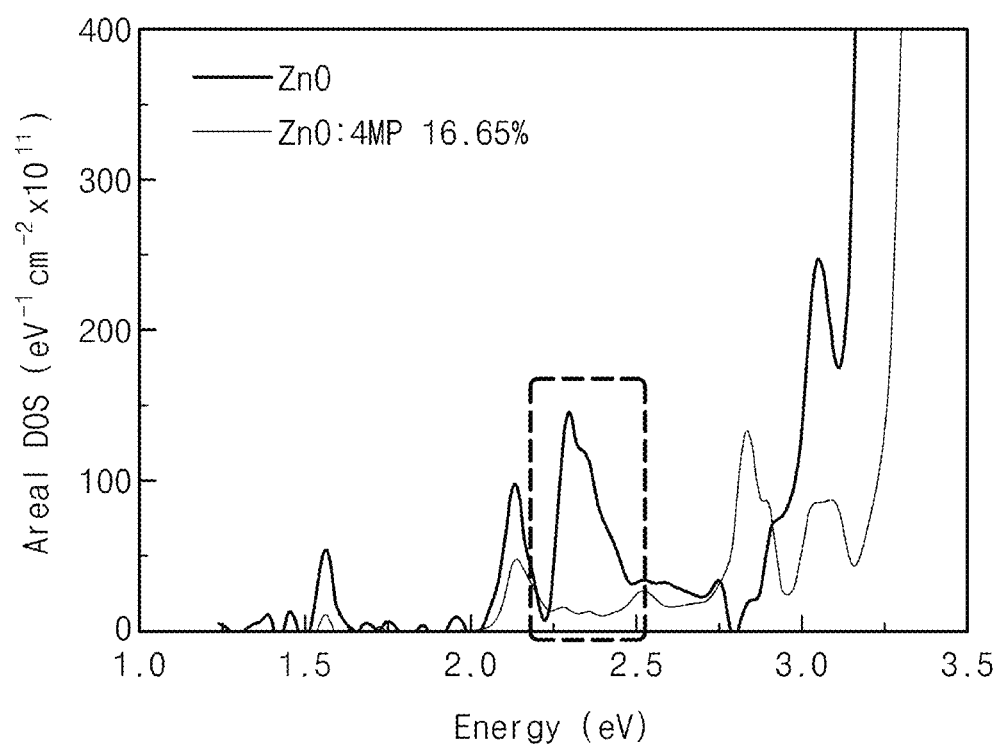

TRANSPARENT ACTIVE LAYER, THIN FILM TRANSISTOR COMPRISING SAME, AND METHOD FOR MANUFACTURING SAME

CROSS-REFERENCE TO RELATED APPLICATION

This application is a continuation of pending International Application No. PCT/KR2016/011285, which was filed on Oct. 8, 2016, and claims priority to Korean Patent Application No. 10-2015-0141686, filed on Oct. 8, 2015, in the Korean Intellectual Property Office, the disclosures of which are hereby incorporated by reference in their entireties.

BACKGROUND

1. Field

Embodiments of the inventive concepts relate to a transparent active layer, a thin film transistor including the same, and a method of fabricating the thin film transistor. More particularly, embodiments of the inventive concepts relate to a thin film transistor which includes a transparent active layer formed by providing a first source including zinc and a second source including sulfur on a plastic substrate, and a method of fabricating the thin film transistor.

2. Description of the Related Art

Recently, large-area, ultra-high definition (UHD) and high-speed display devices have been demanded and flexible display devices applicable to wearable devices have been demanded. Since a general amorphous silicon thin film transistor has a low mobility (0.5 $cm^2/Vs$ or less), it is not suitable for the large-area and UHD display devices and the flexible display devices.

Organic thin film transistors and oxide thin film transistors have been studied in order to solve these problems. For example, Korean Patent Publication No. 10-2011-0095530 (Application No. 10-2010-0015052) discloses an organic thin film transistor that includes a gate insulating layer having a recess region in an upper portion thereof and an organic semiconductor layer disposed in the recess region of the gate insulating layer in order to reduce an operation voltage and to simplify fabricating processes.

For another example, in order to prevent a signal delay in a large-area display device, Korean Patent Publication No. 10-2008-0054941 (Application No. 10-2006-0127671) discloses a source/drain electrode that is formed of a first conductive layer and a second conductive layer having a low resistance to reduce a contact resistance between a compound semiconductor layer and the source/drain electrode.

SUMMARY

Embodiments of the inventive concepts may provide a transparent active layer with high reliability, a thin film transistor including the same, and a method of fabricating the thin film transistor.

Embodiments of the inventive concepts may also provide a transparent active layer having high flexibility, a thin film transistor including the same, and a method of fabricating the thin film transistor.

Embodiments of the inventive concepts may further provide a thin film transistor capable of improving an on/off ratio, and a method of fabricating the same.

Embodiments of the inventive concepts may further provide a transparent active layer with high mobility, a thin film transistor including the same, and a method of fabricating the thin film transistor.

Embodiments of the inventive concepts may further provide a transparent active layer capable of being easily deposited on a plastic substrate, a thin film transistor including the same, and a method of fabricating the thin film transistor.

In an aspect, a method of fabricating a thin film transistor may include preparing a plastic substrate, forming a transparent active layer on the plastic substrate through an atomic layer deposition method by providing a first source including zinc on the plastic substrate and providing a second source including sulfur on the plastic substrate, providing a gate electrode overlapping with the transparent active layer, and providing a gate insulating layer between the gate electrode and the transparent active layer. A ratio of the providing of the first source to the providing of the second source may range from 7:1 to 13:1.

According to an embodiment, the first source and the second source may be provided at a process temperature of 80 degrees Celsius.

According to an embodiment, flexibility of the transparent active layer may be adjusted by adjusting the number of times the first source and the second source are provided, under the condition that the ratio of the providing of the first source to the providing of the second source ranges from 7:1 to 13:1.

According to an embodiment, the flexibility of the transparent active layer may increase as a ratio of the providing of the second source to the providing of the first source increases.

According to an embodiment, the second source may have a thiol group.

In another aspect, a thin film transistor may include a plastic substrate, a transparent active layer disposed on the plastic substrate and including sulfur of 2.60% to 6.45% and zinc of 33.98% to 43.90%, a gate electrode overlapping with the transparent active layer, and a gate insulating layer between the gate electrode and the transparent active layer.

According to an embodiment, the thin film transistor may have an on/off ratio of $10^6$ or more.

According to an embodiment, the transparent active layer may have a mobility of 7 $cm^2/Vs$ or more.

BRIEF DESCRIPTION OF THE DRAWINGS

FIG. 1 is a flowchart illustrating a method of fabricating a thin film transistor including a transparent active layer according to some embodiments of the inventive concepts.

FIG. 2 is a cross-sectional view illustrating a first embodiment of a thin film transistor including a transparent active layer according to some embodiments of the inventive concepts.

FIG. 3 is a cross-sectional view illustrating a second embodiment of a thin film transistor including a transparent active layer according to some embodiments of the inventive concepts.

FIG. 4 is a schematic block diagram illustrating a display device including a thin film transistor according to some embodiments of the inventive concepts.

FIGS. 5A to 5E are graphs for explaining current-voltage characteristics of a thin film transistor including a transparent active layer according to some embodiments of the inventive concepts.

FIG. 6 is a graph showing a growth rate of a transparent active layer according to some embodiments of the inventive concepts.

FIG. 7 shows graphs of an elastic modulus and a hardness of a transparent active layer according to some embodiments of the inventive concepts.

FIGS. 8A and 8B are graphs showing current-voltage characteristics according to bias stress of a thin film transistor according to some embodiments of the inventive concepts.

FIGS. 8C and 8D are graphs showing threshold voltage characteristics according to bias stress of a thin film transistor according to some embodiments of the inventive concepts.

FIG. 9 is a graph showing an analysis of a defect in a transparent active layer according to some embodiments of the inventive concepts.

DETAILED DESCRIPTION OF THE EMBODIMENTS

The inventive concepts will now be described more fully hereinafter with reference to the accompanying drawings, in which exemplary embodiments of the inventive concepts are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In addition, in explanation of the present invention, the descriptions to the elements and functions of related arts may be omitted if they obscure the subjects of the inventive concepts.

FIG. 1 is a flowchart illustrating a method of fabricating a thin film transistor including a transparent active layer according to some embodiments of the inventive concepts.

Referring to FIG. 1, a plastic substrate is prepared (S110). The plastic substrate may be flexible. For example, the plastic substrate may be a PET substrate, a PES substrate, a PEN substrate, a PC substrate, or a PI substrate. The plastic substrate may be prepared in a chamber.

A transparent active layer may be formed on the plastic substrate through an atomic layer deposition (ALD) method by providing a first source including zinc (Zn) on the plastic substrate and providing a second source including sulfur (S) on the plastic substrate (S120). For example, the first source may be diethyl zinc (DEZn) or dimethyl zinc (DMZn). In some embodiments, the second source may have a thiol group. For example, the second source may include at least one of 4-mercaptophenol, 2-sulfanylphenol, 3-sulfanylphenol, benzenedithiol, 1,3-benzenedithiol, or 1,4-benzenedithiol.

In an embodiment, providing the first source including zinc may include supplying the first source into the chamber, purging the chamber with an inert gas (e.g., an argon gas), supplying $H_2O$ into the chamber, and purging the chamber with an inert gas. In this case, a zinc oxide thin film may be formed on the plastic substrate.

In addition, in an embodiment, providing the second source including sulfur may include supplying the first source into the chamber, purging the chamber with an inert gas, supplying the second source into the chamber, and purging the chamber with an inert gas. In this case, a compound thin film of zinc and sulfur may be formed on the plastic substrate. Stability in air and reliability of the transparent active layer may be improved by combination of zinc and sulfur.

In addition, when the second source includes the organic material as described above, the transparent active layer may be a composite thin film of the organic material and an inorganic material.

According to an embodiment of the inventive concepts, a process temperature in the chamber may be maintained at 100 degrees Celsius or less while the first source and the second source are provided. Thus, molecules in the first source and the second source may be packed at high density, and the molecules packed at the high density may provide a large number of active sites that are easy to react with subsequently supplied molecules. As a result, quality of the transparent active layer or quality of zinc oxide in the transparent active layer may be improved.

Unlike the aforementioned embodiment of the inventive concepts, if a process temperature in the chamber is a high temperature (e.g., higher than 100 degrees Celsius) while the first source and the second source are provided, a growth rate of the transparent active layer may be reduced. In other words, molecules in the first source and the second source may be packed at low density, and thus quality of a film or layer may be deteriorated and process efficiency may be reduced. Thus, a mobility of the transparent active layer may be reduced.

However, according to the aforementioned embodiment of the inventive concepts, the process temperature in the chamber may be maintained at 100 degrees Celsius or less while the first source and the second source are provided, and thus the transparent active layer having a high mobility may be fabricated.

If a ratio of providing the first source to providing the second source is lower than 7:1, the mobility of the transparent active layer may be significantly reduced, and an on/off ratio of a thin film transistor fabricated using the transparent active layer may also be significantly reduced. In addition, if the ratio of providing the first source to providing the second source is higher than 13:1, the on/off ratio of the thin film transistor fabricated using the transparent active layer may be significantly reduced. Thus, according to some embodiments of the inventive concepts, the ratio of providing the first source to providing the second source may range from 7:1 to 13:1. Providing the first source and providing the second source may be performed at the ratio of 7:1 to 13:1, and thus the transparent active layer may include sulfur of 2.60% to 6.45% and zinc of 33.98% to 43.90% and may have a mobility of 7 $cm^2/Vs$ or more. In addition, a thin film transistor fabricated using the transparent active layer may have an on/off ratio of $10^6$ or more.

According to an embodiment, the ratio of providing the first source to providing the second source may be adjusted in the range of 7:1 to 13:1 to adjust an elastic modulus and a hardness of the transparent active layer. In other words, flexibility of the transparent active layer may be adjusted by adjusting the number of times the first source and the second source are provided. In detail, as the number of times the second source including sulfur is provided increases, the elastic modulus and the hardness of the transparent active layer may decrease to increase the flexibility of the transparent active layer. However, as described above, if the ratio of providing the first source to providing the second source is lower than 7:1, the mobility of the transparent active layer may be significantly reduced, and the on/off ratio of the thin film transistor fabricated using the transparent active layer may be significantly reduced.

A gate electrode overlapping with the transparent active layer may be provided (S130). The gate electrode may be provided on the transparent active layer or may be provided between the transparent active layer and the plastic substrate. In other words, embodiments of the inventive concepts are not limited to a formation order of the transparent active layer and the gate electrode.

A gate insulating layer may be provided between the transparent active layer and the gate electrode (S140). As described above, embodiments of the inventive concepts are not limited to a formation order of the transparent active layer and the gate insulating layer.

According to the embodiments of the inventive concepts, providing the first source and providing the second source may be performed at the ratio of 7:1 to 13:1 under the condition of the low temperature process, and thus the transparent active layer may be formed on the plastic substrate. Thus, the transparent active layer may be easily formed on the plastic substrate vulnerable to heat. In addition, the quality of the transparent active layer may be improved to increase the mobility of the transparent active layer, and the thin film transistor of which the on/off ratio is improved may be provided.

As described above, the transparent active layer according to the embodiments of the inventive concepts may be disposed on the gate electrode or may be disposed under the gate electrode. Embodiments of a thin film transistor including the transparent active layer according to the embodiments of the inventive concepts will be described hereinafter with reference to FIGS. 2 and 3.

FIG. 2 is a cross-sectional view illustrating a first embodiment of a thin film transistor including a transparent active layer according to some embodiments of the inventive concepts.

Referring to FIG. 2, a thin film transistor may include a gate electrode 110 on a plastic substrate 100, a gate insulating layer 120, a transparent active layer 130, a drain electrode 152d, and a source electrode 152s.

The plastic substrate 100 may be flexible as described with reference to FIG. 1.

The gate electrode 110 may be formed on the plastic substrate 100. The gate electrode 110 may be formed of a metal. The gate electrode 110 may be formed of a transparent conductive material. Alternatively, the gate electrode 110 may include nickel (Ni), chromium (Cr), molybdenum (Mo), aluminum (Al), titanium (Ti), copper (Cu), tungsten (W), or any alloy thereof.

The gate insulating layer 120 may be formed on the gate electrode 110. The gate insulating layer 120 may be formed of at least one of silicon oxide, silicon nitride, silicon oxynitride, or a high-k dielectric material such as a metal oxide (e.g., aluminum oxide or hafnium oxide).

The transparent active layer 130 may be formed on the gate insulating layer 120. The transparent active layer 130 may be formed by the method described with reference to FIG. 1. The transparent active layer 130 may be spaced apart from and overlap with the gate electrode 110 with the gate insulating layer 120 interposed therebetween.

A passivation layer 140 may be formed on the transparent active layer 130. The passivation layer 140 may be formed of silicon oxide, silicon nitride, or silicon oxynitride.

The source electrode 152s may penetrate the passivation layer 140 so as to be connected to a portion of the transparent active layer 130 which is adjacent to a side of the gate electrode 110. The drain electrode 152d may penetrate the passivation layer 140 so as to be connected to a portion of the transparent active layer 130 which is adjacent to another side of the gate electrode 110. The source electrode 152s and the drain electrode 152d may be formed of aluminum or a transparent conductive material (e.g., ITO).

FIG. 3 is a cross-sectional view illustrating a second embodiment of a thin film transistor including a transparent active layer according to some embodiments of the inventive concepts.

Referring to FIG. 3, a thin film transistor may include a transparent active layer 210 on a plastic substrate 200, a gate insulating layer 220, a gate electrode 230, a passivation layer 240, a source electrode 250s, and a drain electrode 250d.

The plastic substrate 200 may be flexible as described with reference to FIG. 1. The transparent active layer 210 may be formed by the method described with reference to FIG. 1.

The gate insulating layer 220 may be formed on the transparent active layer 210. The gate insulating layer 220 may be formed of the same material as the gate insulating layer 120 described with reference to FIG. 2.

The gate electrode 230 may be formed on the gate insulating layer 220 and may overlap with the transparent active layer 210. The gate electrode 230 may be formed of the same material as the gate electrode 110 described with reference to FIG. 2.

The passivation layer 240 may be formed on the gate electrode 230. The passivation layer 240 may be formed of an insulating material (e.g., silicon oxide, silicon nitride, or silicon oxynitride).

The source electrode 250s may penetrate the passivation layer 240 and the gate insulating layer 220 so as to be connected to a portion of the transparent active layer 210 which is adjacent to a side of the gate electrode 230. The drain electrode 250d may penetrate the passivation layer 240 and the gate insulating layer 220 so as to be connected to a portion of the transparent active layer 210 which is adjacent to another side of the gate electrode 230.

The thin film transistor according to the aforementioned embodiments of the inventive concepts may be used in a display device. A display device including the thin film transistor according to the embodiments of the inventive concepts will be described hereinafter with reference to FIG. 4.

FIG. 4 is a schematic block diagram illustrating a display device including a thin film transistor according to some embodiments of the inventive concepts.

Referring to FIG. 4, a display device according to some embodiments of the inventive concepts may include a display unit 300, a timing controller 310, a gate driving unit 330, a data driving unit 340, and a power supply unit 350.

The display unit 300 may include gate lines, data lines crossing the gate lines, and pixel cells formed in crossing areas of the gate lines and the data lines.

The pixel cell may include at least one of the thin film transistors according to the aforementioned embodiments of the inventive concepts. The pixel cell may also include an organic light-emitting diode or a liquid crystal layer. The thin film transistor of the aforementioned embodiments, which is included in the pixel cell, may be provided as a PMOS transistor or an NMOS transistor.

The gate line may supply a gate signal GS, which is supplied from the gate driving unit 330, to the pixel cell. The thin film transistor according to the inventive concepts, which is included in the pixel cell, may be turned-on in response to the gate signal GS. The data line may supply a display data voltage DDV, which is supplied from the data driving unit 340, to the pixel cell.

The timing controller 310 may receive a data signal I-DATA from an external system and may supply the data signal I-DATA to the data driving unit 340. In addition, on the basis of a signal supplied from the external system, the timing controller 310 may provide a gate control signal GCS and a data control signal DCS to the gate driving unit 330 and the data driving unit 340, respectively.

The power supply unit 350 may supply a gate-on-voltage VON/a gate-off-voltage VOFF to the gate driving unit 330 and may supply an analog driving voltage AVDD to the data driving unit 340. In addition, the power supply unit 350 may supply a driving voltage VDD and a common voltage Vcom to the display unit 300.

The thin film transistor according to the embodiments of the inventive concepts is used in the display device in FIG. 4. However, embodiments of the inventive concepts are not limited thereto. In other embodiments, the thin film transistor according to the embodiments of the inventive concepts may be used in other various electronic devices.

In addition, the transparent active layer according to the embodiments of the inventive concepts is used in the thin film transistors in the embodiments of FIGS. 2 to 4. However, embodiments of the inventive concepts are not limited thereto. In other embodiments, the transparent active layer according to the embodiments of the inventive concepts may be applied to other various fields such as a diode, a variable resistance memory device, a solar cell, and an optical electrode.

Characteristic evaluation results of the transparent active layer and the thin film transistor including the same according to the aforementioned embodiments will be described hereinafter.

Deposition of Thin Films According to Embodiments and Comparative Examples

DEZn was prepared as the first source including zinc, and 4-mercaptophenol was prepared as the second source including sulfur. Transparent active layers were deposited on plastic substrates by using ratios of providing DEZn to providing 4-mercaptophenol, which were shown in the following table 1.

In detail, providing DEZn (i.e., supplying DEZn and $H_2O$ into a chamber) and providing 4-mercaptophenol (i.e., supplying DEZn and 4-mercaptophenol into the chamber) were performed at ratios of 13:1, 10:1, and 7:1, respectively, while maintaining a temperature in the chamber at 80 degrees Celsius, and thus transparent active layers (ZnO:4MP) according to first to third embodiments were deposited.

In addition, DEZn and $H_2O$ were supplied into a chamber while maintaining a temperature in the chamber at 80 degrees Celsius, thereby depositing a transparent active layer (ZnO thin film) according to a first comparative example. Furthermore, providing DEZn (i.e., supplying DEZn and $H_2O$ into the chamber) and providing 4-mercaptophenol (i.e., supplying DEZn and 4-mercaptophenol into the chamber) were performed at ratios of 20:1 and 3:1, respectively, while maintaining the temperature in the chamber at 80 degrees Celsius, and thus transparent active layers (ZnO:4MP) according to second and third comparative examples were deposited.

TABLE 1

| Classification | Providing DEZn:Providing 4-mercaptophenol |
|---|---|
| First comparative example | Deposition of ZnO thin film without 4-mercaptophenol |
| Second comparative example | 20:1 |
| First embodiment | 13:1 |
| Second embodiment | 10:1 |
| Third embodiment | 7:1 |
| Third comparative example | 3:1 |

FIGS. 5A to 5E are graphs for explaining current-voltage characteristics of a thin film transistor including a transparent active layer according to some embodiments of the inventive concepts.

Referring to FIGS. 5A to 5E, thin film transistors were fabricated using the transparent active layers according to the first to third embodiments and the first to third comparative examples. Current-voltage characteristics of the thin film transistors were measured as shown in FIGS. 5A to 5E. Composition ratios of the transparent active layers were measured as shown in the following table 2. Mobilities of the transparent active layers and on/off ratios of the thin film transistors were measured as shown in the following table 3.

TABLE 2

| Classification | % Zn | % O | % S | % C |
|---|---|---|---|---|
| First comparative example | 52.09 | 47.91 | 0.00 | 0.00 |
| Second comparative example | 45.85 | 44.66 | 2.02 | 8.47 |
| First embodiment | 43.90 | 44.47 | 2.60 | 10.93 |
| Second embodiment | 35.19 | 36.28 | 5.86 | 22.67 |

TABLE 2-continued

| Classification | % Zn | % O | % S | % C |
|---|---|---|---|---|
| Third embodiment | 33.98 | 35.99 | 6.45 | 23.58 |
| Third comparative example | 26.63 | 29.17 | 10.12 | 34.08 |

TABLE 3

| Classification | Mobility (cm²/Vs) | On/off ratio |
|---|---|---|
| First comparative example | 12.35 | $7 * 10^4$ |
| Second comparative example | 8.99 | $1.1 * 10^5$ |
| First embodiment | 7.76 | $1 * 10^6$ |
| Second embodiment | 7.55 | $2 * 10^6$ |
| Third embodiment | 7.21 | $6 * 10^6$ |
| Third comparative example | 0.162 | $4 * 10^3$ |

As shown in FIGS. 5A to 5E and the table 2, the mobility of the transparent active layer increases as a ratio of ZnO in the transparent active layer increases by an increase in the ratio of providing DEZn to providing 4-mercaptophenol. In addition, when providing DEZn and providing 4-mercaptophenol are performed at the ratio of 13:1 to 7:1 according to the first to third embodiments, the transparent active layer has the high mobility and the thin film transistor has the high on/off ratio. In more detail, the on/off ratio in the case in which the ratio of providing DEZn to providing 4-mercaptophenol is 13:1 is about 10 times greater than the on/off ratio in the case in which the ratio of providing DEZn to providing 4-mercaptophenol is 20:1. The on/off ratio in the case in which the ratio of providing DEZn to providing 4-mercaptophenol is 7:1 is about 1500 times greater than the on/off ratio in the case in which the ratio of providing DEZn to providing 4-mercaptophenol is 3:1. In other words, according to embodiments of the inventive concepts, the ratio of providing DEZn to providing 4-mercaptophenol is adjusted in the range of 13:1 to 7:1 while maintaining the temperature in the chamber at a low temperature (e.g., 80 degrees Celsius) at which the plastic substrate can be used, and thus the transparent active layer having both the high mobility and the high on/off ratio can be effectively deposited.

FIG. 6 is a graph showing a growth rate of a transparent active layer according to some embodiments of the inventive concepts.

Referring to FIG. 6, providing DEZn and providing 4-mercaptophenol were performed at the ratio of 7:1 according to the third embodiment described above, thereby depositing a transparent active layer. At this time, a growth rate of the transparent active layer according to a change in temperature in a chamber was measured as shown in FIG. 6.

As shown in FIG. 6, when the temperature in the chamber is higher than 100 degrees Celsius, the growth rate is sharply reduced. In other words, when the temperature in the chamber is higher than 100 degrees Celsius, packing densities of molecules in DEZn and 4-mercaptophenol are reduced. Thus, the quality of the transparent active layer is deteriorated and the process efficiency is reduced. In other words, the temperature in the chamber may be maintained at 100 degrees Celsius or less to effectively deposit the high quality transparent active layer.

FIG. 7 shows graphs of an elastic modulus and a hardness of a transparent active layer according to some embodiments of the inventive concepts.

Referring to FIG. 7, an elastic modulus and a hardness of each of the transparent active layers according to the first to third embodiments and the first and third comparative examples were measured. As shown in FIG. 7, as a ratio of providing 4-mercaptophenol to providing DEZn increases, the amount of 4-mercaptophenol in the transparent active layer increases. Thus, the flexibility of the transparent active layer is improved. In other words, the flexibility of the transparent active layer can be easily adjusted by adjusting the ratio of providing DEZn to providing 4-mercaptophenol.

FIGS. 8A and 8B are graphs showing current-voltage characteristics according to bias stress of a thin film transistor according to some embodiments of the inventive concepts, and FIGS. 8C and 8D are graphs showing threshold voltage characteristics according to bias stress of a thin film transistor according to some embodiments of the inventive concepts.

Referring to FIGS. 8A to 8D, current-voltage characteristics and threshold voltage characteristics according to bias stress were measured from the thin film transistor including the transparent active layer (ZnO thin film) according to the first comparative example and the thin film transistor including the transparent active layer formed by performing providing DEZn and providing 4-mercaptophenol at the ratio of 7:1 according to the third embodiment.

In more detail, a bias voltage of 15V was applied to the thin film transistor including the transparent active layer (ZnO thin film) according to the first comparative example to evaluate the current-voltage characteristics, and a bias voltage of 20V was applied to the thin film transistor including the transparent active layer according to the third embodiment to evaluate the current-voltage characteristics. In addition, bias voltages of 10V and 15V were applied to the thin film transistor including the transparent active layer (ZnO thin film) according to the first comparative example to measure the threshold voltage characteristics, and bias voltages of −10V, −15V, −20V, 10V, 15V and 20V were applied to the thin film transistor including the transparent active layer according to the third embodiment to measure the threshold voltage characteristics.

As shown in FIGS. 8A to 8D, reliability on the bias stress of the thin film transistor, which includes the transparent active layer formed by performing providing DEZn and providing 4-mercaptophenol at the ratio of 7:1 according to the inventive concepts, is significantly increased.

FIG. 9 is a graph showing an analysis of a defect in a transparent active layer according to some embodiments of the inventive concepts.

Referring to FIG. 9, defects in the transparent active layer (ZnO thin film) of the first comparative example and defects in the transparent active layer of the third embodiment were measured using a photo-excited charge collection spectroscopy (PECCS) analysis method.

As shown in a portion indicated by a dotted line in FIG. 9, the defects in the transparent active layer according to the third embodiment formed by providing DEZn and providing 4-mercaptophenol are much less than the defects in the transparent active layer (ZnO thin film) according to the first comparative example formed by providing DEZn without providing 4-mercaptophenol. In other words, the defects in ZnO are effectively removed by 4-mercaptophenol provided in the deposition of the transparent active layer.

The transparent active layer, the thin film transistor including the same and the method of fabricating the thin film transistor according to the embodiments of the inventive concepts may be applied to various electronic devices such as a display device and a logic circuit.

According to some embodiments of the inventive concepts, providing the first source including zinc and providing the second source including sulfur may be performed at the ratio of 7:1 to 13:1 on the plastic substrate, and thus the transparent active layer may be deposited on the plastic substrate at the low temperature through the ALD method. Thus, the transparent active layer may be easily deposited on the plastic substrate vulnerable to a high temperature and may have the high mobility. In addition, the on/off ratio of the thin film transistor including the transparent active layer may be improved. As a result, the transparent active layer with the high reliability, the thin film transistor including the same and the method of fabricating the thin film transistor may be provided.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of fabricating a thin film transistor, the method comprising:
    preparing a plastic substrate;
    forming a transparent active layer on the plastic substrate through an atomic layer deposition method by providing a first source including zinc on the plastic substrate and providing a second source including sulfur on the plastic substrate, wherein a ratio of the providing of the first source to the providing of the second source ranges from 7:1 to 13:1;
    providing a gate electrode overlapping with the transparent active layer; and
    providing a gate insulating layer between the gate electrode and the transparent active layer.

2. The method of claim 1, wherein the first source and the second source are provided at a process temperature of 80 degrees Celsius.

3. The method of claim 1, wherein flexibility of the transparent active layer is adjusted by adjusting the number of times the first source and the second source are provided, under the condition that the ratio of the providing of the first source to the providing of the second source ranges from 7:1 to 13:1.

4. The method of claim 3, wherein the flexibility of the transparent active layer increases as a ratio of the providing of the second source to the providing of the first source increases.

5. The method of claim 1, wherein the second source has a thiol group.

6. A thin film transistor comprising:
    a plastic substrate;
    a transparent active layer disposed on the plastic substrate and including sulfur of 2.60% to 6.45%, zinc of 33.98% to 43.90%, oxygen of 35.99% to 44.47%, and carbon of 10.93% to 23.58%;
    a gate electrode overlapping with the transparent active layer; and
    a gate insulating layer between the gate electrode and the transparent active layer.

7. The thin film transistor of claim 6, wherein the thin film transistor has an on/off ratio of $10^6$ or more.

8. The thin film transistor of claim 6, wherein the transparent active layer has a mobility of 7 $cm^2/Vs$ or more.

9. The thin film transistor of claim 6, wherein the gate electrode is in direct contact with the plastic substrate.

* * * * *